(12) United States Patent
Lee et al.

(10) Patent No.: US 11,462,148 B2
(45) Date of Patent: Oct. 4, 2022

(54) PIXEL ARRAY SUBSTRATE

(71) Applicant: Au Optronics Corporation, Hsinchu (TW)

(72) Inventors: Min-Tse Lee, Hsinchu (TW);
Sheng-Yen Cheng, Hsinchu (TW);
Ping-Wen Chen, Hsinchu (TW);
Yueh-Hung Chung, Hsinchu (TW);
Ya-Ling Hsu, Hsinchu (TW);
Chen-Hsien Liao, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 130 days.

(21) Appl. No.: 16/984,174

(22) Filed: Aug. 4, 2020

(65) Prior Publication Data

US 2021/0056887 A1    Feb. 25, 2021

Related U.S. Application Data (60) Provisional application No. 62/889,181, filed on Aug. 20, 2019.

(30) Foreign Application Priority Data

May 20, 2020   (TW) .................................. 109116616

(51) Int. Cl.
*G09G 5/00*     (2006.01)
*G09G 3/20*     (2006.01)
(Continued)

(52) U.S. Cl.
CPC ............ *G09G 3/2092* (2013.01); *G02F 1/13* (2013.01); *G02F 1/13456* (2021.01);
(Continued)

(58) Field of Classification Search
CPC ................... G09G 3/20; G09G 3/2092; G09G 2300/0408; G09G 2310/0267;
(Continued)

(56) References Cited

U.S. PATENT DOCUMENTS 8,189,130 B2   5/2012   Chen et al.
8,570,480 B2   10/2013  Chiang et al.
(Continued)

FOREIGN PATENT DOCUMENTS

TW      I392943      4/2013
TW      I397756      6/2013
TW      I483050      5/2015

*Primary Examiner* — Adam J Snyder
(74) *Attorney, Agent, or Firm* — JCIPRNET (57) ABSTRACT

A pixel array substrate includes a substrate, a plurality of data lines, a plurality of scan lines, a plurality of sub-pixels, and a first and a second auxiliary lines. The plurality of sub-pixels are arranged into first rows arranged in a first direction and second rows arranged in a second direction. The first auxiliary line and the plurality of scan lines belong to a first conductive layer. The second auxiliary line and the plurality of data lines belong to a second conductive layer. The first auxiliary line is located between two scan lines. A first end of the first auxiliary line is connected to one of the two scan lines. A second end of the first auxiliary line is separated from the other one of the two scan lines. The second auxiliary line is electrically connected to the first auxiliary line at the second end through a conductive via.

19 Claims, 11 Drawing Sheets

(51) Int. Cl.
G02F 1/1345 (2006.01)
G02F 1/1362 (2006.01)
G02F 1/13 (2006.01)
H01L 27/12 (2006.01)

(52) U.S. Cl.
CPC ......... *G02F 1/136286* (2013.01); *G09G 3/20* (2013.01); *G09G 2300/0408* (2013.01); *G09G 2310/0267* (2013.01); *G09G 2310/0275* (2013.01); *G09G 2310/0278* (2013.01); *H01L 27/1237* (2013.01); *H01L 27/1244* (2013.01)

(58) Field of Classification Search
CPC .... G09G 2310/0275; G09G 2310/0278; G02F 1/13; G02F 1/13456; G02F 1/136286; H01L 27/1237; H01L 27/1244
See application file for complete search history.

(56) References Cited

U.S. PATENT DOCUMENTS

| | | | | |
|---|---|---|---|---|
| 2002/0044227 A1* | 4/2002 | Lee | ................... | G02F 1/134363 349/40 |
| 2003/0030381 A1* | 2/2003 | Yamazaki | ........... | G02F 1/13454 315/169.3 |
| 2007/0132684 A1* | 6/2007 | Baek | .................... | G09G 3/3614 345/87 |
| 2009/0040166 A1* | 2/2009 | Lee | ........................ | G02F 1/1345 345/98 |
| 2010/0171687 A1 | 7/2010 | Chiang et al. | | |
| 2010/0296016 A1* | 11/2010 | Chen | ................. | G02F 1/136286 349/147 |
| 2014/0152938 A1* | 6/2014 | Lee | ....................... | G09G 3/3648 438/30 |
| 2017/0294172 A1* | 10/2017 | Yang | .................... | G09G 3/3648 |
| 2018/0158838 A1* | 6/2018 | Chen | ..................... | H01L 27/156 |
| 2020/0174315 A1* | 6/2020 | Nakagawa | ........... | G09G 3/3614 |

* cited by examiner

PIXEL ARRAY SUBSTRATE

CROSS-REFERENCE TO RELATED APPLICATION

This application claims the priority benefits of U.S. provisional application Ser. No. 62/889,181, filed on Aug. 20, 2019, and Taiwan application serial no. 109116616, filed on May 20, 2020. The entirety of each of the above-mentioned patent applications is hereby incorporated by reference herein and made a part of this specification.

BACKGROUND

Technical Field

The disclosure relates to a pixel array substrate.

Description of Related Art

In order to meet various needs from electronic apparatuses, it is sometimes necessary to connect horizontal scan lines through a vertical auxiliary line, so that a gate driving circuit and a data driving circuit may be arranged on the same side of a display region. However, under such a design framework, pixel voltages of a plurality of sub-pixels adjacent to the auxiliary line may be affected by a coupling effect due to turning on/off of a gate signal, resulting in a grey scale or brightness variation of the sub-pixels and poor image performance.

SUMMARY

The disclosure provides a pixel array substrate capable of mitigating an influence generated by a coupling effect.

An embodiment of the disclosure provides a pixel array substrate including a substrate, a plurality of data lines, a plurality of scan lines, a plurality of sub-pixels, a first auxiliary line, and a second auxiliary line. The data lines are disposed on the substrate and arranged in a first direction. The scan lines are disposed on the substrate and arranged in a second direction, wherein the second direction intersects with the first direction. The sub-pixels are disposed on the substrate and arranged into a plurality of first rows arranged in the first direction and a plurality of second rows arranged in the second direction. Each of the first rows is electrically connected to at least one data line, and each of the second rows is electrically connected to one scan line. The first auxiliary line is disposed on the substrate, wherein the first auxiliary line and the scan lines belong to a first conductive layer. The second auxiliary line is disposed on the substrate, wherein the second auxiliary line and the data lines belong to a second conductive layer. The first auxiliary line is located between two scan lines. The first auxiliary line has a first end and a second end opposite to the first end. The first end is connected to one of the two scan lines. The second end is separated from the other one of the two scan lines. The second auxiliary line is electrically connected to the first auxiliary line at the second end through a conductive via.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

It should be understood that when a device such as a layer, a film, a region, or a substrate is referred to as "on" or "connected" to another device, it may be directly on or connected to the other device, or other devices probably exist there between. Comparatively, when the device is referred to be "directly on" or "directly coupled" to another device, none other device exits there between. The "connection" used herein may refer to both physical and/or electrical connections. Furthermore, "electrical connection" may refer to that there are other devices between the two devices.

The terms "about", "substantial" or "approximate" used herein include the related value and an average within an acceptable deviation range for a specific value determined by those skilled in the art, considering a discussed measurement and a specific number of errors related to the measurement (i.e., a limitation of a measuring system). For example, "about" may represent a range within one or a plurality of standard deviations of the related value, or within ±30%, ±20%, ±10%, ±5%. Moreover, an acceptable deviation range or standard deviation may be selected for the "about", "approximate" or "substantial" used in the specification based on optical properties, etching properties, or other properties without using one standard deviation for all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be noted that in the accompanying figures, each of the drawings depicts typical features of methods, structures, and/or materials used in the particular exemplary embodiments. However, these drawings are not to be interpreted as limiting or limiting the scope or property covered by these exemplary embodiments. For example, for clarity, relative thickness and position of each film layer, region and/or structure may be reduced or enlarged, or some film layers or elements may be omitted.

Figure 1:
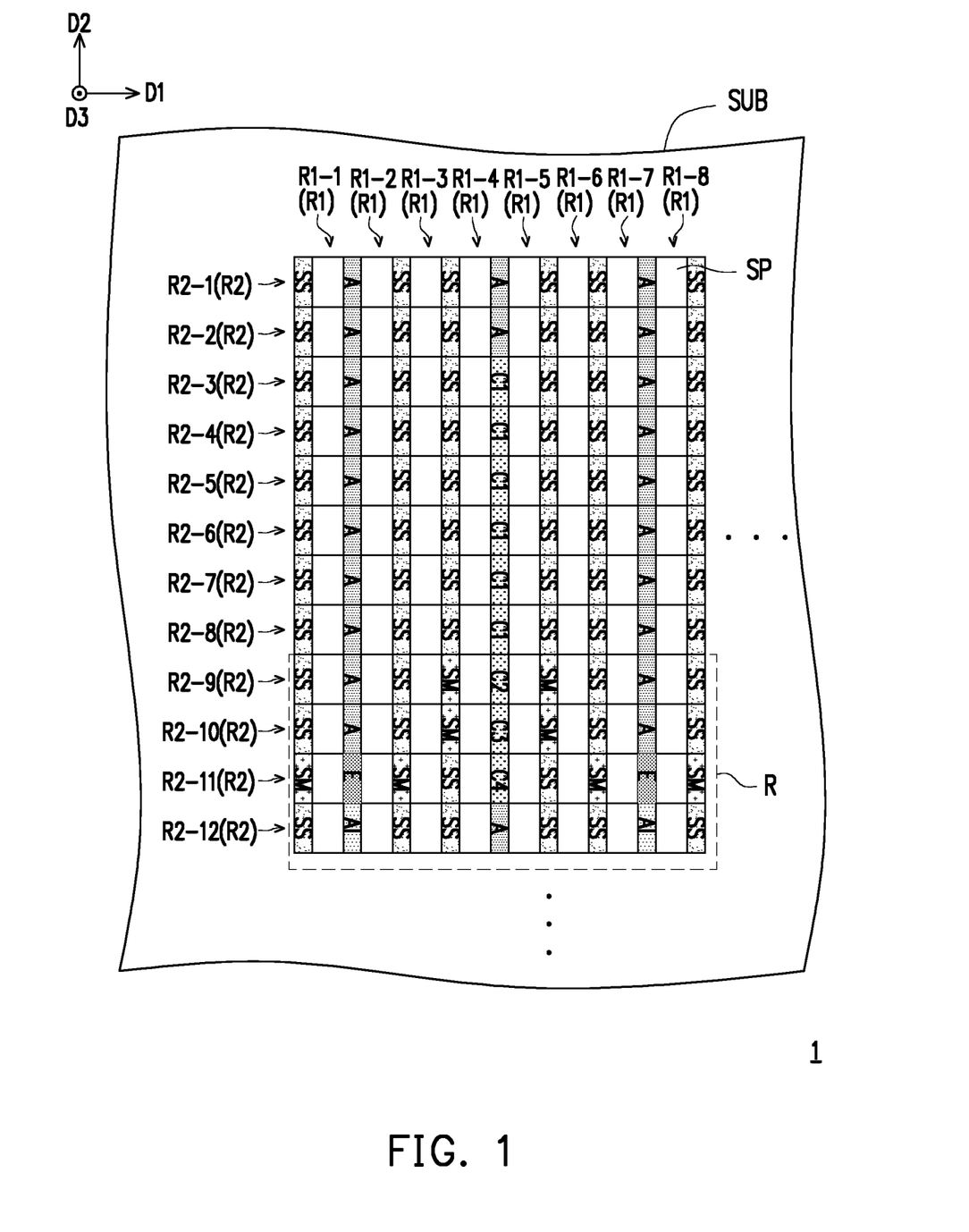
FIG. 1 is a partial top view of a pixel array substrate according to an embodiment of the disclosure.

FIG. 1 is a partial top view of a pixel array substrate according to an embodiment of the disclosure. Referring to FIG. 1, a pixel array substrate 1 includes a substrate SUB, a plurality of sub-pixels SP and a plurality of wiring units (for example, wiring units A, wiring units A1, wiring units C1, wiring units C2, wiring units C3, wiring units C4, wiring units E, wiring units SS, and wiring units SM).

The substrate SUB is mainly used to carry film layers or devices in the pixel array substrate 1. For example, a material of the substrate SUB may be glass, quartz, organic polymer, such as wafer, ceramic, or other applicable materials.

The sub-pixels SP are disposed on the substrate SUB. The sub-pixels SP are arranged into a plurality of first rows R1 arranged in a first direction D1 and a plurality of second rows R2 arranged in a second direction D2. The second direction D2 intersects with the first direction D1. For example, the second direction D2 may be perpendicular to the first direction D1, but the disclosure is not limited thereto. In FIG. 1, eight first rows R1 (for example, R1-1 to R1-8) and twelve second rows R2 (for example, R2-1 to R2-12) are schematically illustrated, where each first row R1 includes twelve sub-pixels SP, and each second row R2 includes eight sub-pixels SP. However, the number and arrangement of the sub-pixels SP may be changed according to actual needs.

The sub-pixels SP may include sub-pixels of a plurality of colors, such as a plurality of red sub-pixels, a plurality of green sub-pixels, and a plurality of blue sub-pixels, but the disclosure is not limited thereto. Plural (for example, twelve) sub-pixels SP in each first row R1 may have the same color, and plural (for example, eight) sub-pixels SP in each second row R2 may include sub-pixels of a plurality of colors arranged in the first direction D1 in an alternating manner. However, color types and arrangement of the sub-pixels SP may be changed according to actual needs.

The wiring units are disposed on the substrate SUB and are arranged corresponding to the sub-pixels SP. For example, the wiring units and the sub-pixels SP may be arranged in the first direction D1 in an alternating manner. The wiring units may include various lines, such as auxiliary lines for transmitting gate signals, lines for voltage stabilization, repair lines, or other lines. According to different wiring structures (such as a relative arrangement relationship, a connection relationship or other structural design of the lines), the lines located around the sub-pixels SP may be divided into a variety of wiring units. FIG. 1 schematically illustrates nine types of wiring units, for example, the wiring units A, the wiring units A1, the wiring units C1, the wiring units C2, the wiring units C3, the wiring units C4, the wiring units E, the wiring units SS and the wiring units SM. However, the types of the wiring units in the pixel array substrate 1 may be increased or decreased according to actual needs.

Figure 2:
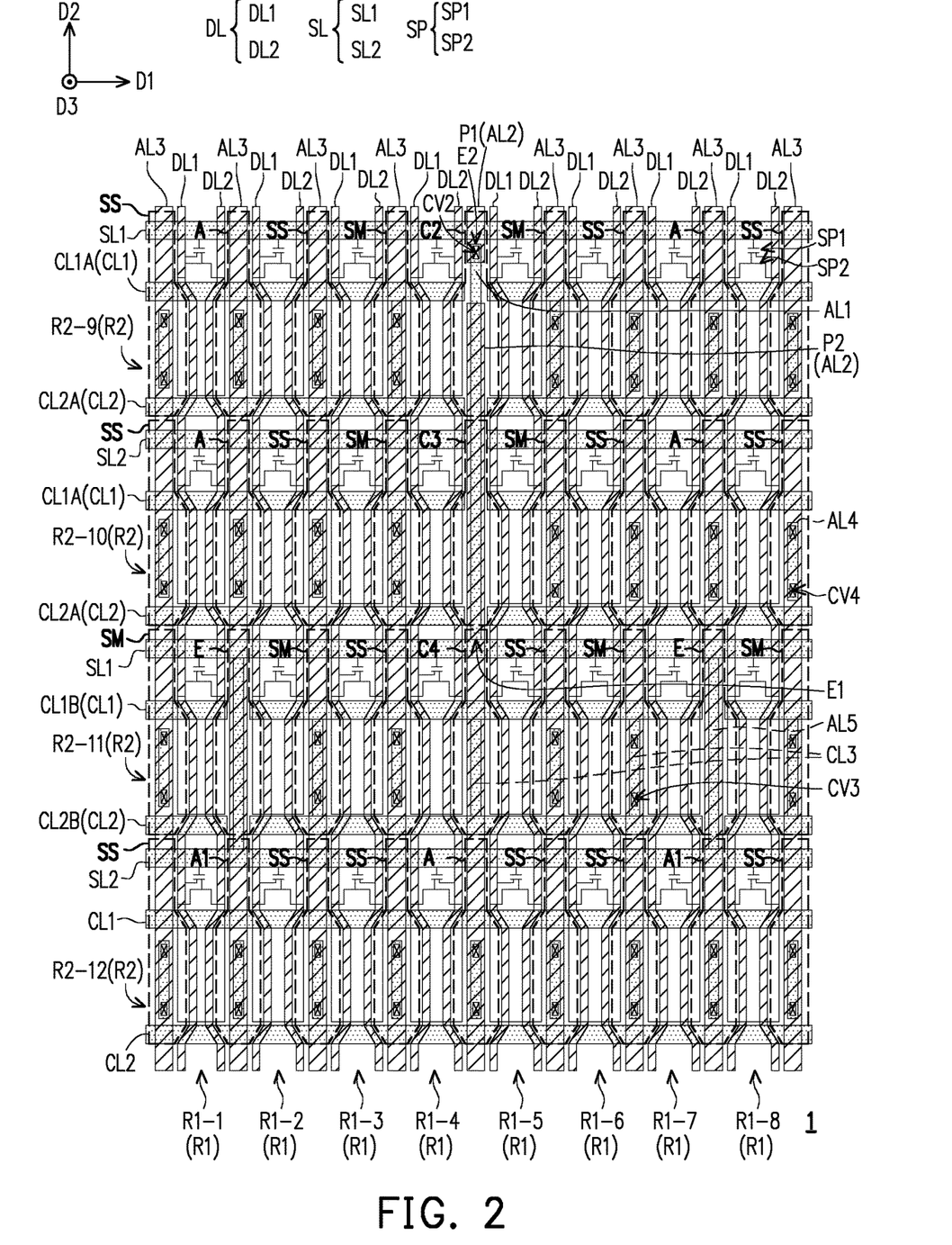
FIG. 2 is a schematic top view of a region R in FIG. 1.

The relative arrangement relationship and detailed structure between the wiring units and the sub-pixels SP may be found with reference to FIG. 2 to FIG. 11. FIG. 2 is a schematic top view of a region R in FIG. 1. FIG. 3 to FIG. 11 are schematic top views of the wiring units C2, C3, C4, C1, A, SS, SM, E, and A1 in FIG. 1. To facilitate understanding, in FIG. 3 to FIG. 11, two sub-pixels SP on the left and right sides of the wiring unit are further illustrated.

An embodiment of the pixel array substrate 1 is described below with reference to FIG. 2 to FIG. 11. In the embodiment, the pixel array substrate 1 includes a circuit structure (including a sub-pixel structure and a wiring structure) suitable for a driving mode of two data lines and half gate line (2DHG). However, it should be understood that the circuit structure of the pixel array substrate 1 may be adapted to other driving modes after some adjustments, such as a driving mode of one data line and one gate line (1D1G), but the disclosure is not limited thereto.

Referring to FIG. 1 and FIG. 2 first, besides the substrate SUB, the sub-pixels SP, and the wiring units, the pixel array substrate 1 may further include a plurality of data lines DL, a plurality of scan lines SL, a first auxiliary line AL1, and a second auxiliary line AL2.

The data lines DL and the scan lines SL are disposed on the substrate SUB, where the data lines DL are arranged in the first direction D1, and the scan lines SL are arranged in the second direction D2.

The data lines DL and the scan lines SL belong to different conductive layers, and the data lines DL and the scan lines SL may be separated by at least one insulating layer. For example, the scan lines SL belong to a first conductive layer, and the data lines DL belong to a second conductive layer.

Based on conductivity, the data lines DL and the scan lines SL may be made of metal materials. However, the data lines DL and the scan lines SL may also be made of other conductive materials, such as alloys, nitrides of metal materials, oxides of metal materials, oxynitrides of metal materials, or a stacked layer of metal materials and other conductive materials.

Each sub-pixel SP may include one or a plurality of active devices SP1 and one or a plurality of pixel electrodes SP2. FIG. 2 to FIG. 11 schematically illustrate that each sub-pixel SP includes one active device SP1 and one pixel electrode SP2. However, the number of the active devices SP1 and the number of the pixel electrodes SP2 included in the sub-pixel SP, or the relative arrangement relationship between the active element SP1 and the pixel electrode SP2 are not limited thereto.

Taking a thin-film transistor as an example, as shown in FIG. 3 to FIG. 11, the active device SP1 may include a gate GE, a gate insulating layer (not shown), a semiconductor layer CH, an insulating layer (not shown), a source SE, and a drain DE. The gate GE is disposed on the substrate SUB and, for example, belongs to the first conductive layer. The gate insulating layer is disposed on the substrate SUB and covers the gate GE. The semiconductor layer CH is disposed on the gate insulating layer and located above the gate GE. The source SE and the drain DE are disposed on the semiconductor layer CH and, for example, belong to the second conductive layer. The insulating layer covers the gate insulating layer, the semiconductor layer CH, and the second conductive layer. The pixel electrode SP2 is disposed on the insulating layer and, for example, belongs to a third conductive layer. The pixel electrode SP2 may be electrically connected to the drain DE through a conductive via CV1 in the insulating layer. The third conductive layer is, for example, a transparent conductive layer. A material of the transparent conductive layer may include metal oxides, such as indium tin oxide, indium zinc oxide, aluminium tin oxide, aluminium zinc oxide, indium germanium zinc oxide, other suitable oxides, or a stacked layer of at least two of the above metal oxides, but the disclosure is not limited thereto.

Referring to FIG. 2, the active device SP1 and the pixel electrode SP2 of each sub-pixel SP are, for example, arranged in the second direction D2. In addition, each first row R1 includes plural sub-pixels SP arranged in the second direction D2. Each first row R1 is electrically connected to at least one data line DL. In other words, each first row R1 may be electrically connected to one data line DL, or each first row R1 may be electrically connected to plural data lines DL (such as two data lines DL located at two opposite sides of the first row R1). The electrical connection between the first row R1 and the data line DL refers to that plural sources SE of plural sub-pixels SP in the first row R1 are electrically connected to the data line DL.

Moreover, each second row R2 includes plural sub-pixels SP arranged in the first direction D1. Each second row R2 is electrically connected to one scan line SL. The electrical connection between the second row R2 and the scan line SL refers to that plural gates GE of plural sub-pixels SP in the second row R2 are electrically connected to the scan line SL.

Taking the driving mode of 2DHG (i.e., a plurality of active devices SP1 in two adjacent second rows R2 are turned on at the same time and data signals are sequentially output to multiple first rows R1) as an example, as shown in FIG. 2, the scan lines SL may include a plurality of first scan lines SL1 and a plurality of second scan lines SL2. The first scan lines SL1 and the second scan lines SL2 are arranged in the second direction D2 in an alternating manner and are electrically connected to a plurality of the second rows R2, respectively. Each first scan line SL1 and the corresponding second scan line SL2 receive scan signals at a same timing, so that a plurality of the active devices SP1 in two adjacent second rows R2 are turned on at the same time. The data lines DL may include a plurality of first data lines DL1 and a plurality of second data lines DL2. The first data lines DL1 and the second data lines DL2 are arranged in the first direction D1 in an alternating manner, where one first data line DL1 and one second data line DL2 are provided between any two adjacent first rows R1. One part of the sub-pixels SP in each first row R1 is electrically connected to one adjacent first data line DL1, and another part of the sub-pixels SP in each first row R1 is electrically connected to one adjacent second data line DL2.

Taking FIG. 1 and FIG. 2 as an example, the pixel array substrate 1 may include at least eight first rows R1 (such as the first row R1-1 through the first row R1-8), and each first row R1 includes at least twelve sub-pixels SP arranged from top to bottom (i.e., arranged in a direction opposite to the second direction D2). In the first row R1-1, the first row R1-2, the first row R1-5 or the first row R1-6, the $9^{th}$ and $12^{th}$ sub-pixels SP are electrically connected to the adjacent first data line DL1, and the $10^{th}$ and $11^{th}$ sub-pixels SP are electrically connected to the adjacent second data line DL2. On the other hand, in the first row R1-3, the first row R1-4, the first row R1-7 or the first row R1-8, the $9^{th}$ and $12^{th}$ sub-pixels SP are electrically connected to the adjacent second data line DL2, and the $10^{th}$ and $11^{th}$ sub-pixels SP are electrically connected to the adjacent first data line DL1.

The first auxiliary line AL1 and the second auxiliary line AL2 are disposed on the substrate SUB, where the first auxiliary line AL1 and the scan lines SL belong to the first conductive layer, and the second auxiliary line AL2 and the data lines DL belong to the second conductive layer.

Figure 11:
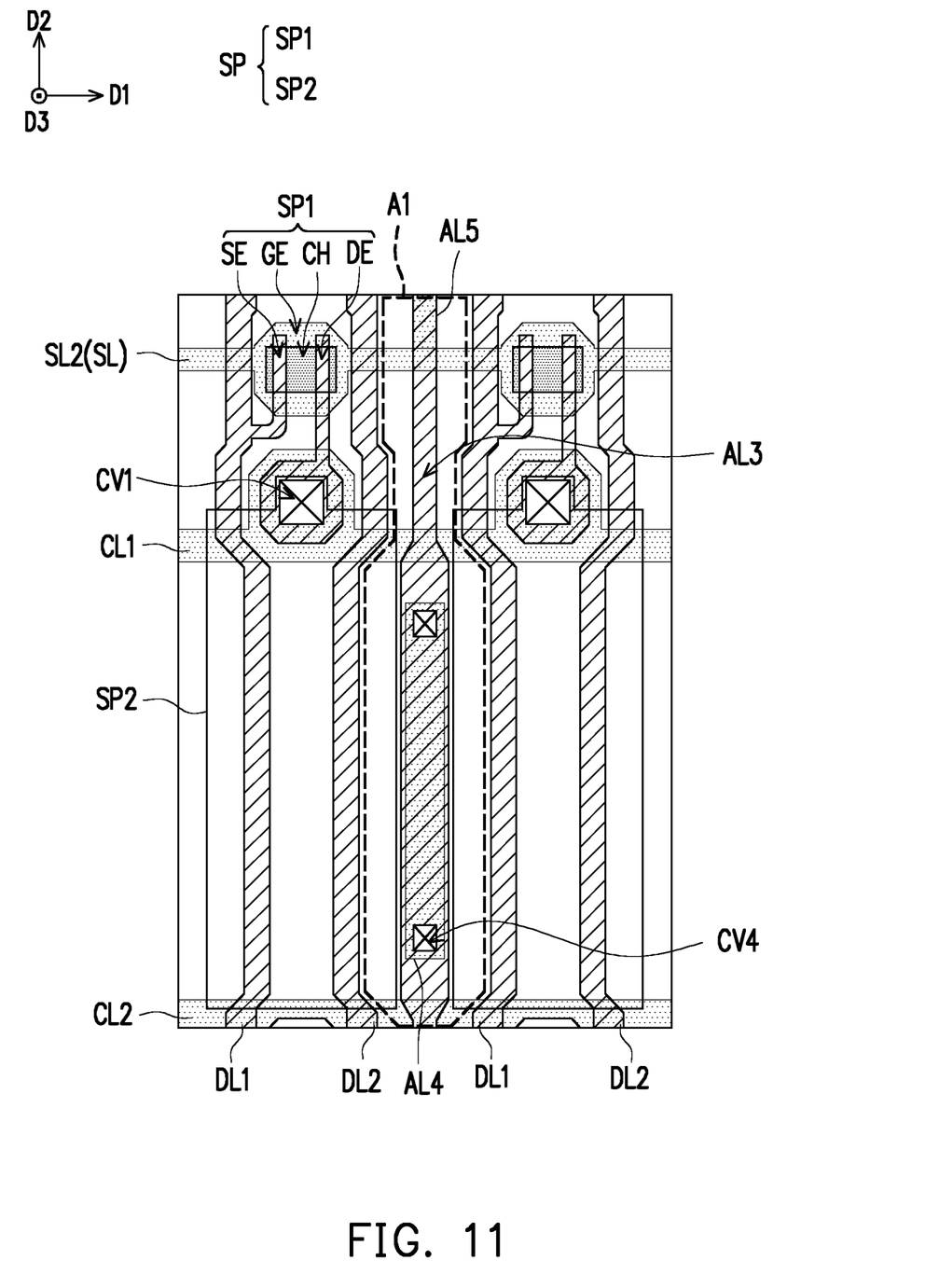

The first auxiliary line AL1 is disposed between two adjacent first rows R1 (such as the first row R1-4 and the first row R1-5), and the first auxiliary line AL1 may be located between two scan lines SL in the second direction D2. The two scan lines SL may be two adjacent scan lines SL, or other scan lines SL may be provided between the two scan lines SL. As shown in FIG. 11, the first auxiliary line AL1 may be located between two adjacent first scan lines SL1, and one second scan line SL2 is provided between the two adjacent first scan lines SL1, for example.

The first auxiliary line AL1 has a first end E1 and a second end E2 opposite to the first end E1. The first end E1 is connected (or contacted) to one of the two scan lines SL (for example, two first scan lines SL1). The second end E2 is separated from (i.e., not connected to) the other one of the two scan lines SL (for example, the two first scan lines SL1). In other words, the two scan lines SL are not connected or electrically connected by the first auxiliary line AL1.

The second auxiliary line AL2 is also located between the first row R1-4 and the first row R1-5. In some embodiments, the second auxiliary line AL2 may overlap with the first auxiliary line AL1 in a normal direction D3 of the substrate SUB to reduce a space between the first row R1-4 and the first row R1-5, but the disclosure is not limited thereto.

The second auxiliary line AL2 and the first auxiliary line AL1 are electrically connected through a conductive via CV2 at the second end E2. In some embodiments, the second auxiliary line AL2 may include a first portion P1 and a second portion P2. The first portion P1 and the second portion P2 are arranged in the second direction D2. The first portion P1 is, for example, connected to a gate signal end, and the first portion P1 extends from the gate signal end toward the second end E2 and crosses the scan line SL (for example, the first scan line SL1) separated from the first auxiliary line AL1 in the two scan lines SL located on two opposite sides of the first auxiliary line AL1, and the first portion P1 is electrically connected to the first auxiliary line AL1 at the second end E2 through the conductive via CV2. The second portion P2 is separated from the first portion P1 at the second end E2. In other words, the second portion P2 is not connected or electrically connected to the first portion P1. The second portion P2 may overlap with the first auxiliary line AL1 in the normal direction D3 of the substrate SUB and crosses the scan line SL (for example, the first scan line SL1) connected to the first auxiliary line AL1, and the second portion P2 is electrically insulated from the first auxiliary line AL1 and the scan line SL (for example, the first scan line SL1) connected to the first auxiliary line AL1.

Based on the above design, the gate signal is transmitted to the corresponding scan line SL sequentially through the first portion P1 of the second auxiliary line AL2 and the first auxiliary line AL1. Since the first auxiliary line AL1 terminates at the corresponding scan line SL, and is unnecessary to be further extended to a position between two adjacent sub-pixels SP (for example, the two sub-pixels SP located at two opposite sides of the wiring unit C4) electrically connected to the corresponding scan line SL, a grey scale or brightness variation of the two sub-pixels SP located at the two opposite sides of the wiring unit C4 due to an influence of a coupling effect between the horizontal scan line SL (for example, the first scan line SL1) and the vertical auxiliary line (the first auxiliary line AL1) is avoided.

Figure 3:
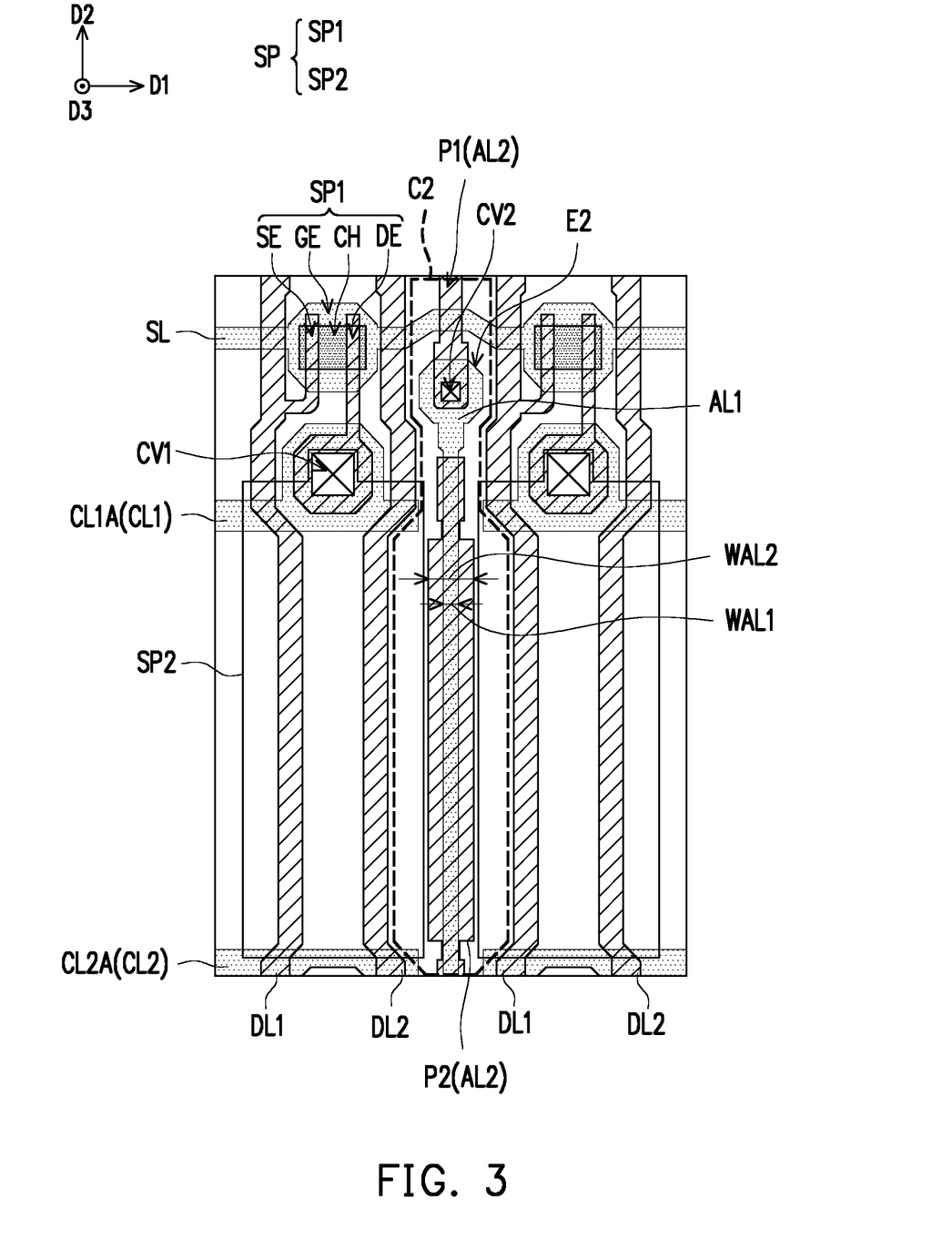
FIG. 3 to FIG. 11 are schematic top views of wiring units C2, C3, C4, C1, A, SS, SM, E, and A1 in FIG. 1.
Figure 4:
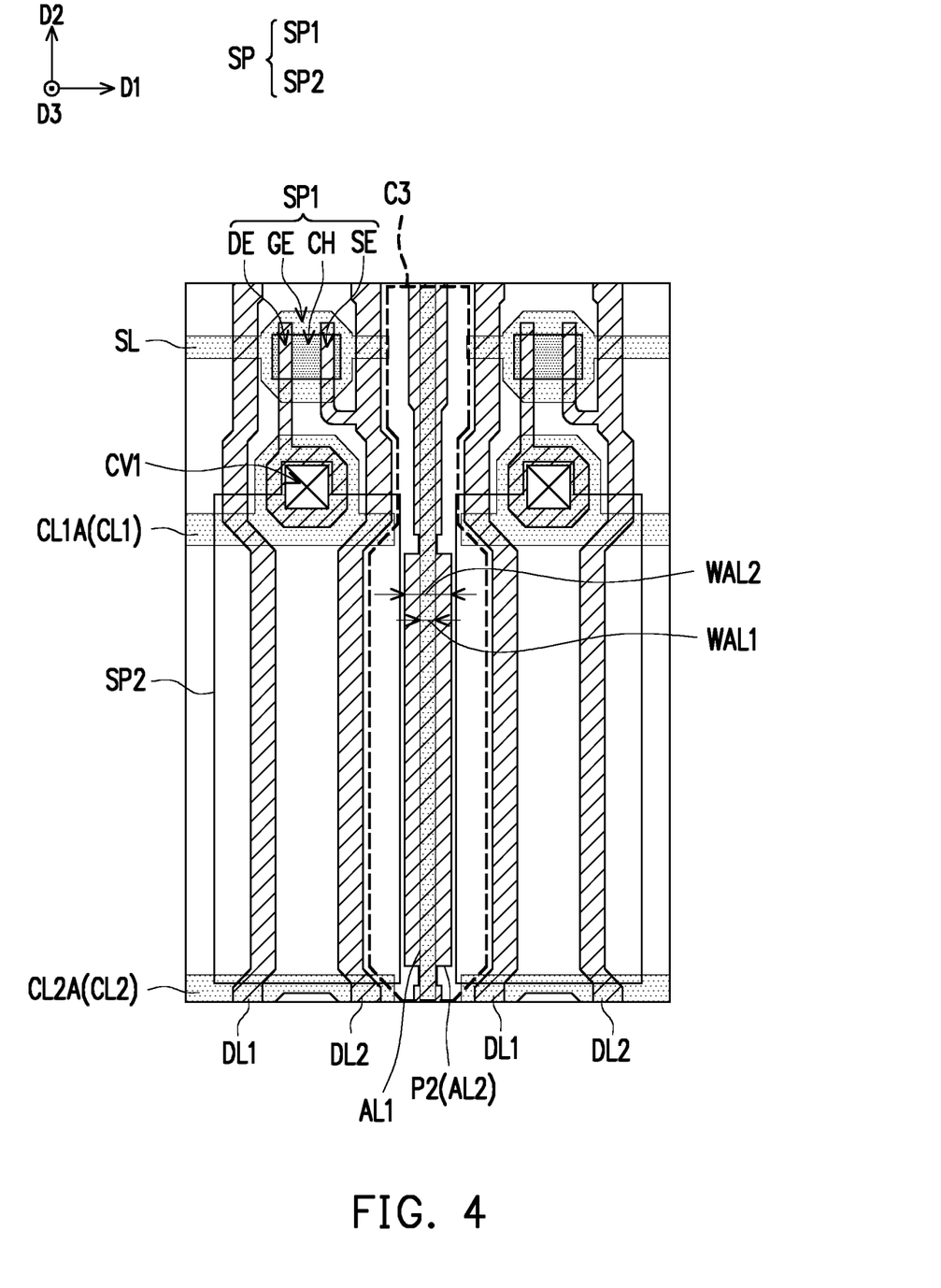
Figure 5:
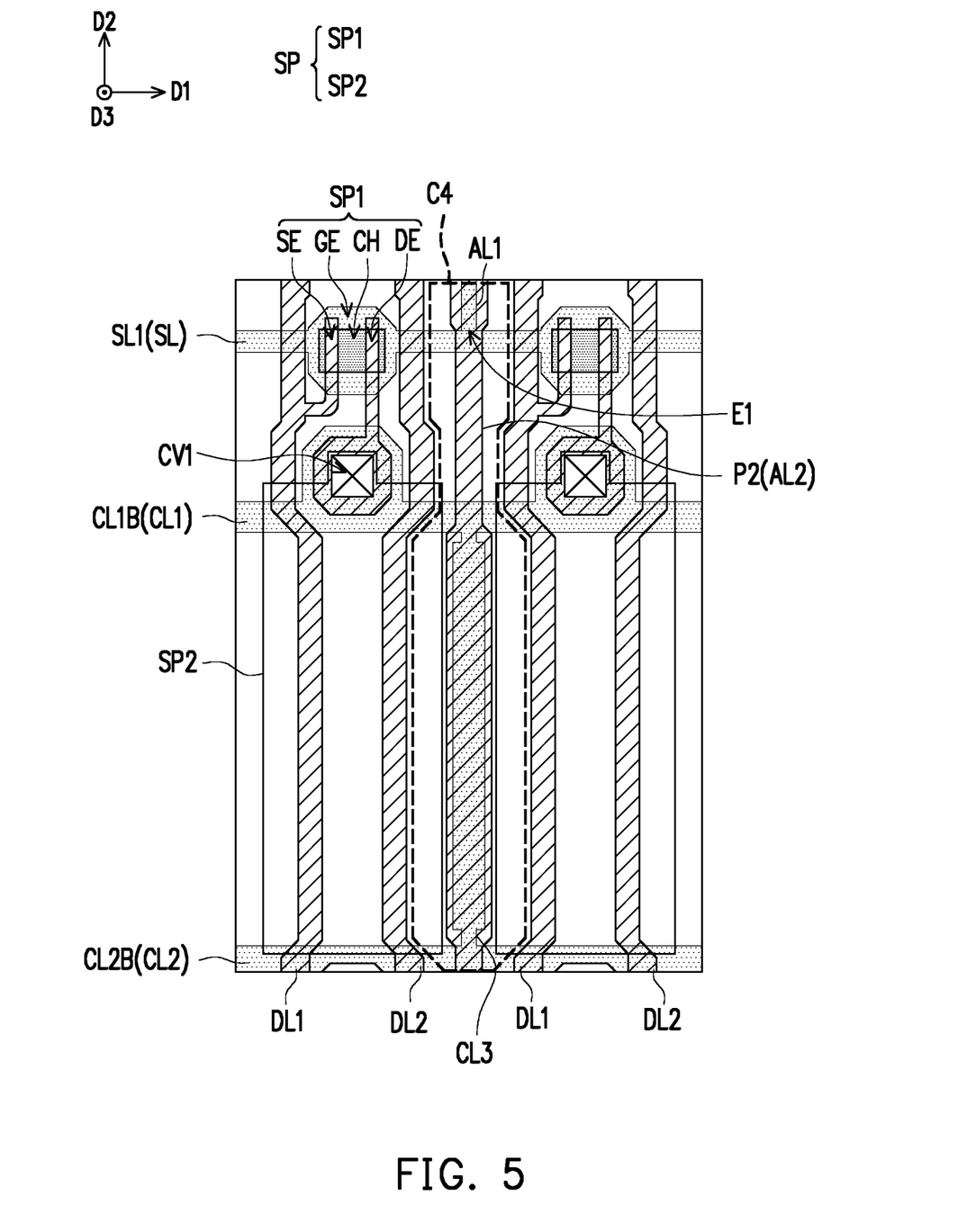
Figure 6:
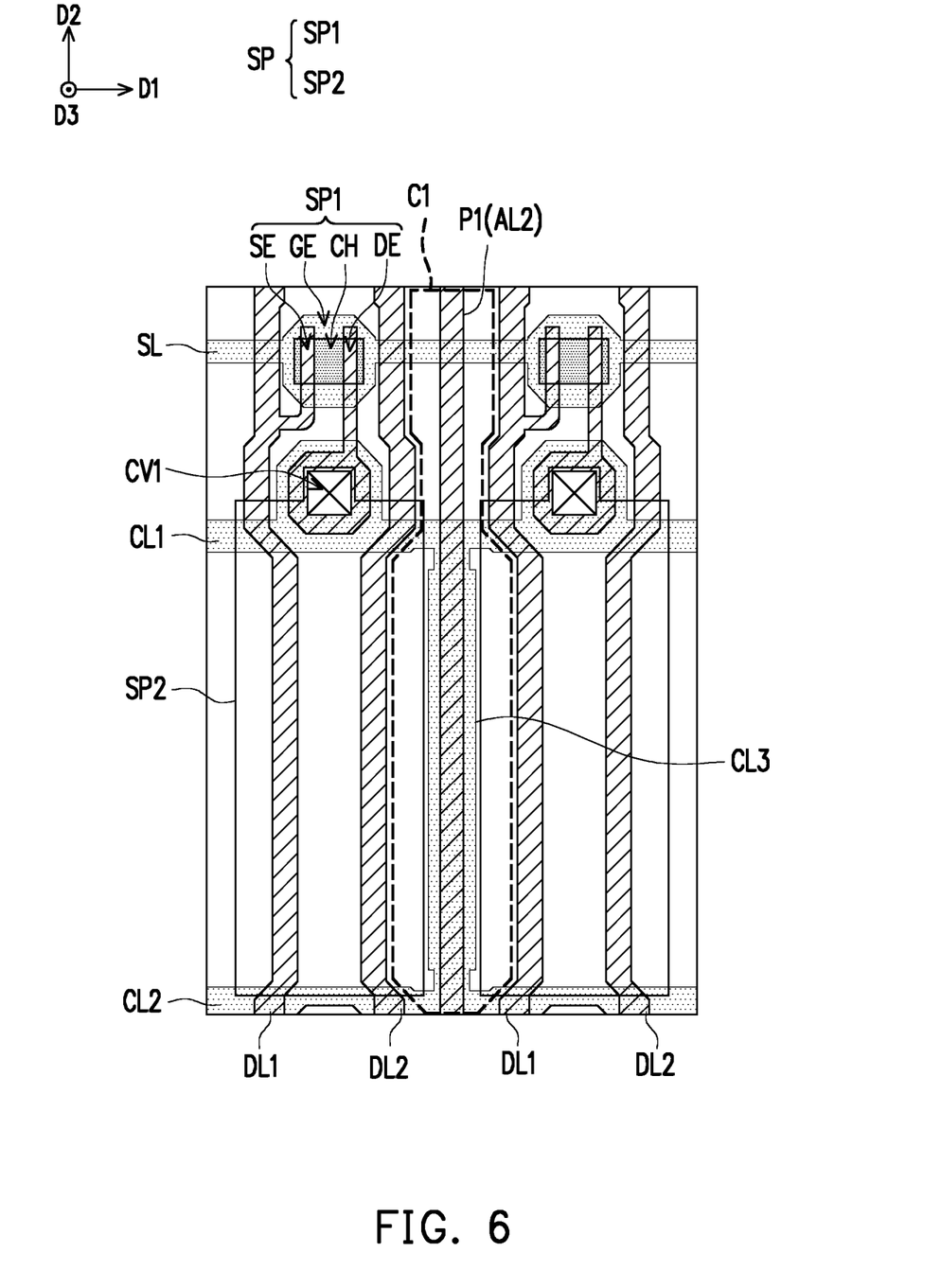
Figure 7:
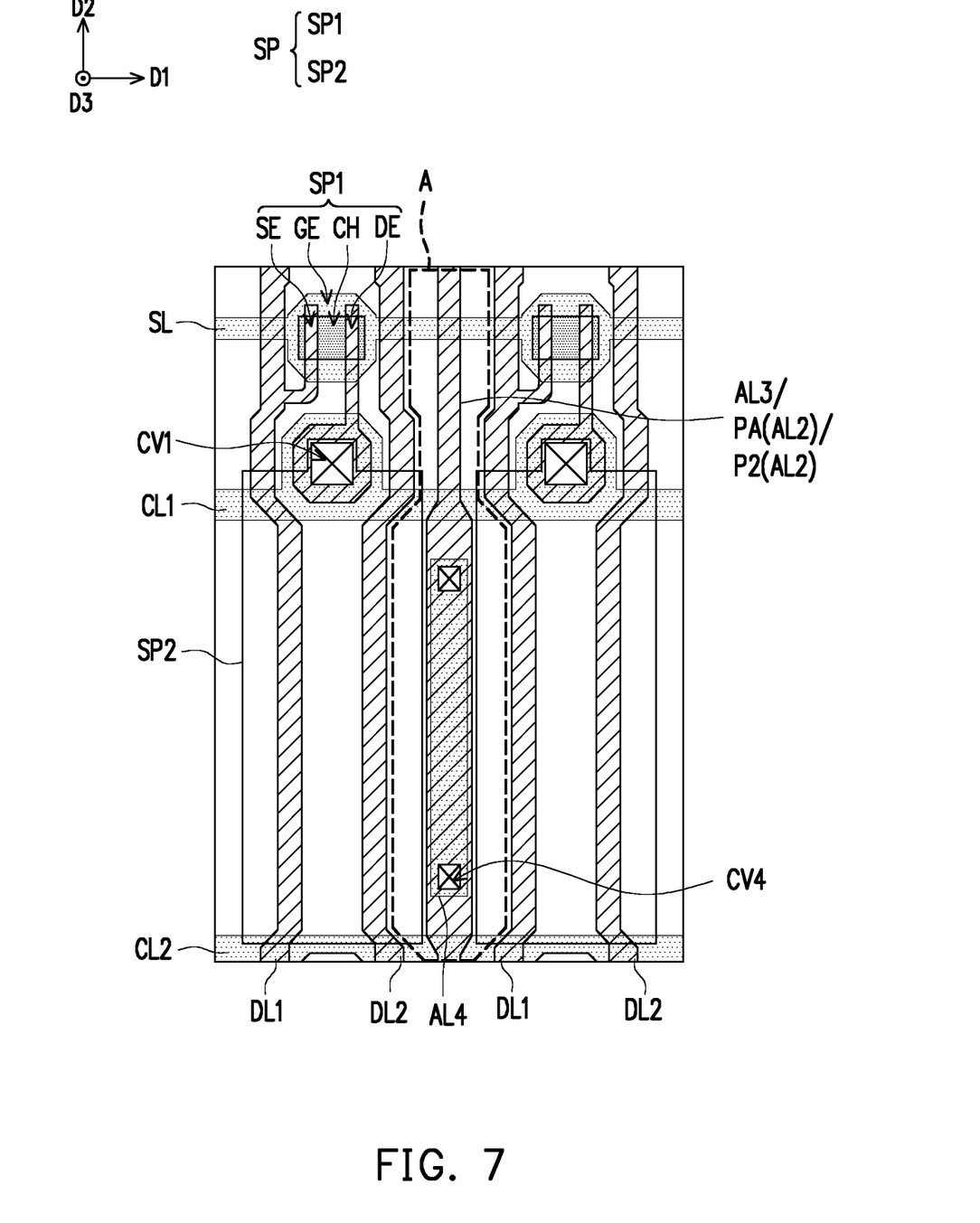
Figure 8:
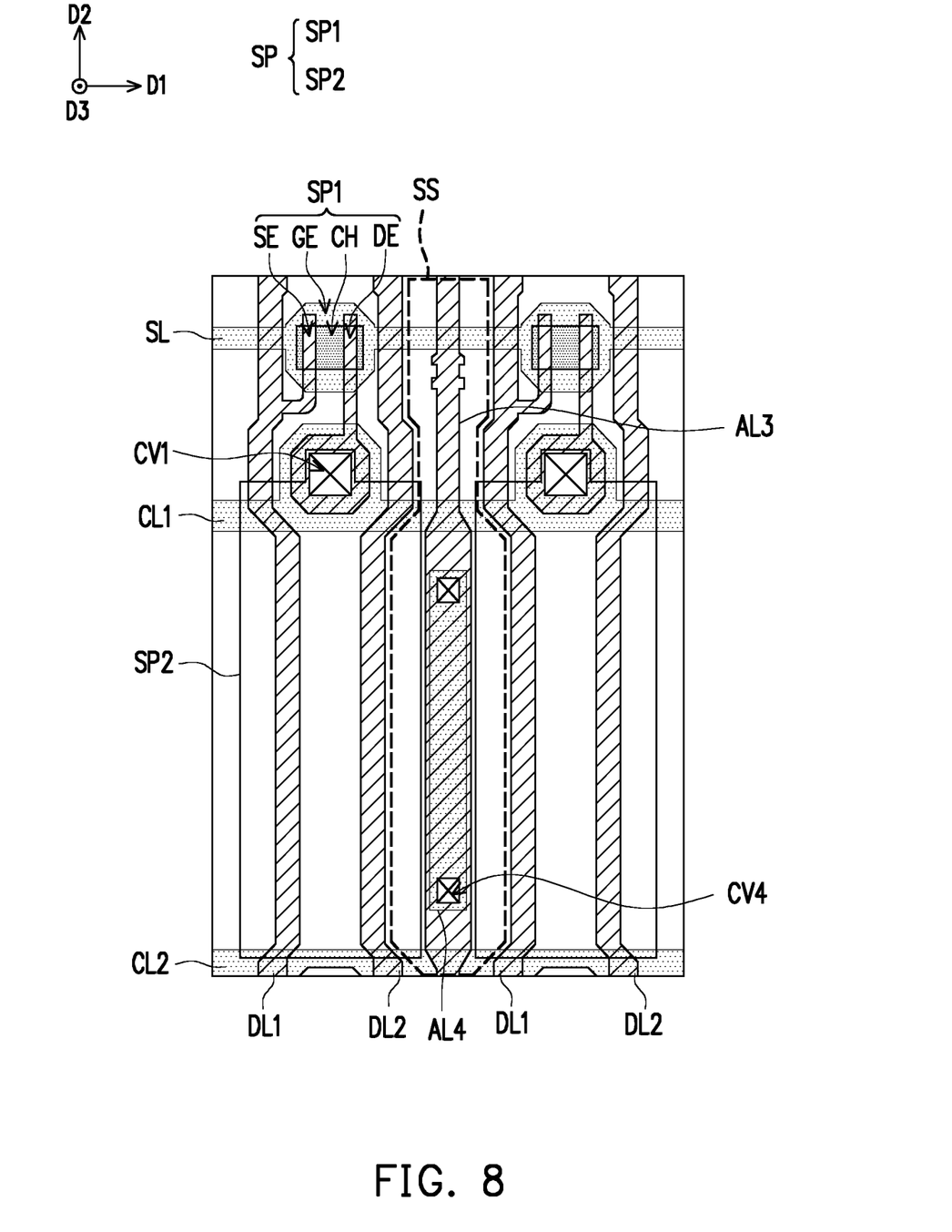
Figure 9:
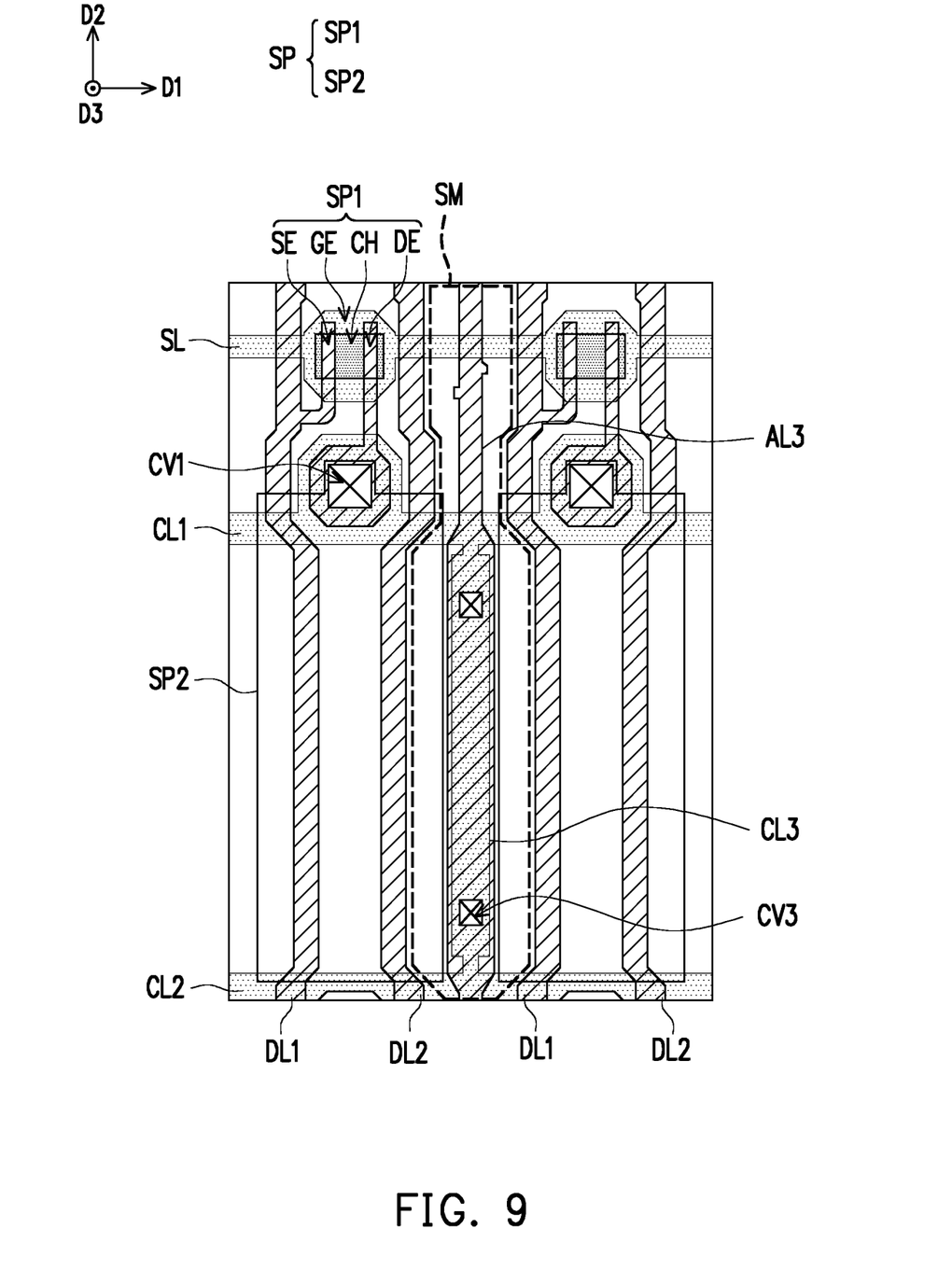

Moreover, during a process that the gate signal is transmitted to the corresponding scan line SL, the gate signal is transmitted to the first auxiliary line AL1 located in the first conductive layer at the second end E2. During the process that the gate signal is transmitted by the first auxiliary line AL1, the second portion P2 of the second auxiliary line AL2 disposed above the first auxiliary line AL1 may shield the first auxiliary line AL1, which avails reducing the influence of capacitive coupling on a plurality of the sub-pixels SP located adjacent to the first auxiliary line AL1 (for example, two sub-pixels SP located on two opposite sides of the wiring unit C2 and two sub-pixels SP located on two opposite sides of the wiring unit C3). In some embodiments, as shown in FIG. 3 and FIG. 4, in an overlapping range of the second portion P2 of the second auxiliary line AL2 and the first auxiliary line AL1, a line width WAL2 of the second portion P2 may be greater than or equal to a line width WAL1 of the first auxiliary line AL1 to further improve the shielding effect. In this specification, a line width of a certain device refers to the maximum width of the device in a direction perpendicular to an extending direction thereof. In some embodiments, the second portion P2 may be connected to a direct current (DC) signal end (not shown) to provide a voltage stabilizing effect. In some other embodiments, a potential of the second portion P2 may be floating.

It should be understood that although FIG. 2 schematically illustrates one first auxiliary line AL1 and one second auxiliary line AL2, the pixel array substrate 1 may include a plurality of the first auxiliary lines AL1 and a plurality of the second auxiliary lines AL2. The first auxiliary lines AL1 may be respectively connected to a plurality of the scan lines SL (for example, a plurality of the first scan lines SL1), and the second auxiliary lines AL2 may be set corresponding to the first auxiliary lines AL1.

According to different needs, the pixel array substrate 1 may further include other devices or film layers. As shown in FIG. 2, the pixel array substrate 1 may further include a plurality of first common electrode lines CL1, a plurality of second common electrode lines CL2, and a plurality of third common electrode lines CL3. The first common electrode lines CL1, the second common electrode lines CL2, and the third common electrode lines CL3 are disposed on the substrate SUB and, for example, belong to the first conductive layer.

The first common electrode lines CL1 and the second common electrode lines CL2 are arranged in the second direction D2 in an alternating manner, where one first common electrode line CL1 and one second common electrode line CL2 are provided between any two adjacent scan lines SL (for example, one first scan line SL1 and one adjacent second scan line SL2). Each third common electrode line CL3 is connected between one first common electrode line CL1 and one adjacent second common electrode line CL2 (referring to the wiring unit C4 and the wiring unit SM). In other words, one first common electrode line CL1 and one adjacent second common electrode line CL2 are electrically connected through the third common electrode line CL3.

In some embodiments, at least one first common electrode line CL1 and at least one second common electrode line CL2 may be provided between the two scan lines SL located at the two opposite ends of the first auxiliary line AL1. FIG. 2 schematically illustrates that two first common electrode lines CL1 (for example, the first common electrode lines CL1A), two second common lines CL2 (for example, the second common electrode line CL2A), and one second scan line SL2 are provided between the two scan lines SL located at the two opposite ends of the first auxiliary line AL1. Since the first auxiliary line AL1, the first common electrode line CL1A, the second common electrode line CL2A, and the second scan line SL2 belong to the same conductive layer (the first conductive layer), the two first common electrode lines CL1A, the two second common electrode lines CL2A and the second scan line SL2 must be respectively disconnected at a position where the first auxiliary line AL1 (referring to the wiring unit C2 and the wiring unit C3) passes to avoid short-circuiting with the first auxiliary line AL1. Each of the disconnected first common electrode lines CL1 and each of the disconnected second common electrode lines CL2 may be electrically connected through a plurality of the third common electrode lines CL3 (referring to the wiring unit SM), and the disconnected second scan line SL2 may be electrically connected to one corresponding first scan line SL1 through a plurality of auxiliary lines (not shown). In some embodiments, at least one third common electrode line CL3 may be provided at each two opposite sides of the first auxiliary line AL1 in the first direction D1 to electrically disconnect the disconnected first common electrode line CL1 and the disconnected second common electrode line CL2.

In some embodiments, the pixel array substrate 1 may further include a plurality of third auxiliary lines AL3. The third auxiliary lines AL3 are disposed on the substrate SUB and, for example, belong to the second conductive layer.

The third auxiliary lines AL3 may be used for voltage stabilization or repair, but the disclosure is not limited thereto. Each third auxiliary line AL3, for example, extends in the second direction D2, and at least one third auxiliary line AL3 is located between two adjacent first rows R1. As shown in FIG. 2, each third auxiliary line AL3 may cross a plurality of the scan lines SL and may be electrically insulated from the scan lines SL.

In some embodiments, each third common electrode line CL3 may overlap with one third auxiliary line AL3 in the normal direction D3 of the substrate SUB (referring to the wiring unit SM). In addition, the number of third common electrode lines CL3 overlapping with the third auxiliary lines AL3 may be greater than or equal to one. Through the design of wire overlapping, a space between two adjacent first rows R1 may be reduced, which avails miniaturization of the volume or improvement of resolution.

In some embodiments, at least one of a plurality of the third common electrode lines CL3 may be electrically connected to the third auxiliary line AL3 (referring to the wiring unit SM) overlapping therewith to reduce a wire resistance. For example, the third common electrode line CL3 may be electrically connected to the third auxiliary line AL3 through a conductive via CV3. FIG. 2 schematically illustrates that each of the two third auxiliary lines AL3 located on the two opposite sides of the second auxiliary line AL2 overlaps with plural (such as two) third common electrode lines CL3 in the normal direction D3 of the substrate SUB and is electrically connected to the plural third common electrode lines CL3, but the disclosure is not limited thereto.

In some embodiments, the pixel array substrate 1 may further include a plurality of fourth auxiliary lines AL4 (referring to the wiring unit SS, the wiring unit A, and the wiring unit A1). The fourth auxiliary lines AL4 are disposed on the substrate SUB and, for example, belong to the first conductive layer.

Each of the fourth auxiliary lines AL4 is located between one first common electrode line CL1 and one adjacent second common electrode line CL2 in the second direction D2, and is separated from the first common electrode line CL1 and the adjacent second common electrode line CL2. In other words, the fourth auxiliary line AL4 does not contact the first common electrode line CL1 and the second common electrode line CL2.

The fourth auxiliary line AL4 is, for example, configured to reduce the wire resistance. In some embodiments, at least one of a plurality of the third auxiliary lines AL3 overlaps with plural fourth auxiliary lines AL4 in the normal direction D3 and is electrically connected to the plural fourth auxiliary lines AL4 (referring to the wiring units SS, A and A1). For example, the third auxiliary line AL3 may be electrically connected to the fourth auxiliary line AL4 through a conductive via CV4.

In some embodiments, the second auxiliary line AL2 overlaps with the plural fourth auxiliary lines AL4 (referring to the wiring unit A) in the normal direction D3 and is electrically connected to the plural fourth auxiliary lines AL4.

In some embodiments, the pixel array substrate 1 may further include fifth auxiliary lines AL5 (referring to the wiring unit E). The fifth auxiliary lines AL5 are disposed on the substrate SUB and, for example, belong to the first conductive layer. FIG. 2 schematically illustrates two fifth auxiliary lines AL5, but the number of the fifth auxiliary lines AL5 included in the pixel array substrate 1 may be changed according to actual needs.

The fifth auxiliary line AL5 is, for example, configured to connect two adjacent scan lines SL (such as one first scan line SL1 and one adjacent second scan line SL2) to implement the driving mode of 2DHG. As shown in FIG. 2, the fifth auxiliary lines AL5 are, for example, located between two adjacent first rows R1 in the first direction D1 (for example, between the first rows R1-1 and R1-2 and between the first rows R1-7 and R1-8). Moreover, the fifth auxiliary line AL5 and the first auxiliary line AL1 are respectively located on the two opposite side of the first scan line SL1 electrically connected to the first auxiliary line AL1 in the second direction D2, and the fifth auxiliary line AL5 connects the first scan line SL1 electrically connected to the first auxiliary line AL1 to the adjacent second scan line SL2 (referring to the wiring unit E and the wiring unit A1).

Figure 10:
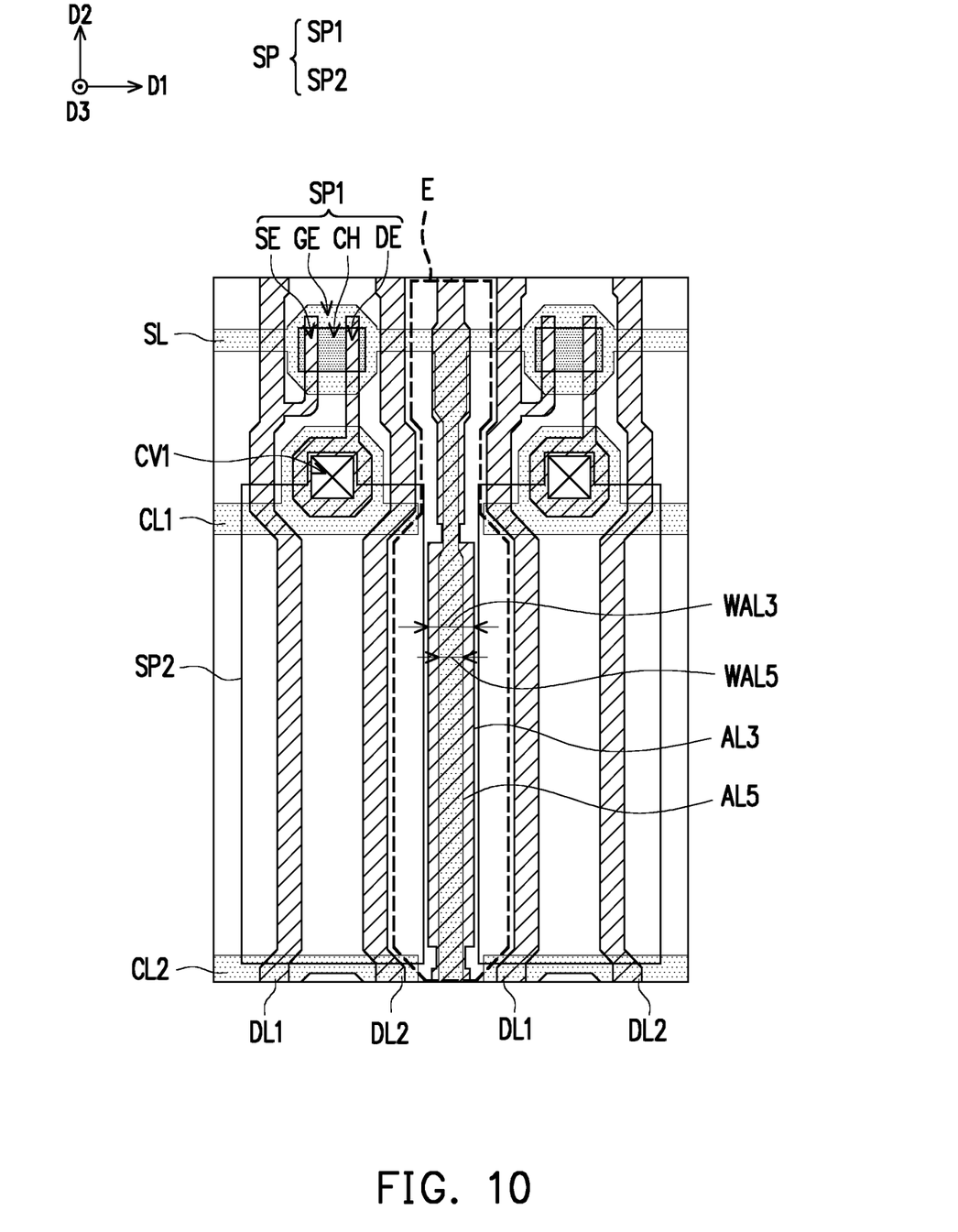

In some embodiments, the fifth auxiliary line AL5 may overlap with the third auxiliary line AL3 in the normal direction D3 of the substrate SUB. During a process that the gate signal is transmitted by the fifth auxiliary line AL5, the third auxiliary line AL3 disposed above the fifth auxiliary line AL5 may shield the fifth auxiliary line AL5, which avails reducing the influence of capacitive coupling on a plurality of the sub-pixels SP located adjacent to the fifth auxiliary line AL5 (for example, the two sub-pixels SP located on two opposite sides of the wiring unit E). In some embodiments, as shown in FIG. 10, a line width WAL3 of the third auxiliary line AL3 may be greater than or equal to a line width WAL5 of the fifth auxiliary line AL5 to further improve the shielding effect.

Referring to FIG. 2 again, one first common electrode line CL1 (for example, a first common electrode line CL1B) and one second common electrode line CL2 (for example, a second common electrode line CL2B) are provided between the first scan line SL1 and the second scan line SL2 connected by the fifth auxiliary line AL5. Since the fifth auxiliary line AL5, the first common electrode line CL1B and the second common electrode line CL2B belong to a same conductive layer (for example, the first conductive layer), the first common electrode line CL1B and the second common electrode line CL2B must be respectively disconnected at a position where the fifth auxiliary line AL5 passes to avoid short-circuiting with the fifth auxiliary line AL5. In some embodiments, the disconnected first common electrode line CL1B and the disconnected second common electrode line CL2B may be electrically connected through at least one third common electrode line CL3 (referring to the wiring unit C4). In some embodiments, the at least one third common electrode line CL3 may overlap with the second auxiliary line AL2 in the normal direction D3 of the substrate SUB and may be electrically insulated from the second auxiliary line AL2.

According to FIG. 1 and FIG. 2, it is known that the wiring units between the first row R1-4 where the first auxiliary line AL1 and the second auxiliary line AL2 are located and the adjacent first row R1-5 include four or more types of wiring units. In FIG. 1 and FIG. 2, the wiring units between the first row R1-4 where the first auxiliary line AL1 and the second auxiliary line AL2 are located and the adjacent first row R1-5, for example, include five types of wiring units A, C1, C2, C3 and C4. However, in other embodiments, the types of the wiring units between the first row R1-4 where the first auxiliary line AL1 and the second auxiliary line AL2 are located and the adjacent first row R1-5 may be changed according to actual needs (for example, the driving mode). Moreover, the types of the wiring units included in the pixel array substrate may also be changed according to the actual needs (for example, the driving mode).

For example, in the driving mode of 1D1G, a plurality of the active devices SP1 located in the same first row R1 may be electrically connected to the same data line DL. In addition, the two scan lines SL located at the two opposite ends of the first auxiliary line AL1 may be two adjacent scan lines SL, i.e., no other scan line SL is provided between the two scan lines SL. Therefore, the wiring unit C3 may be omitted from the pixel array substrate. In addition, the number of the first common electrode line CL1 and the number of the second common electrode line CL2 between the two scan lines SL located at the two opposite ends of the first auxiliary line AL1 may be respectively one, and the one first common electrode line CL1 and the one second common electrode line CL2 are disconnected at a position where the first auxiliary line AL1 passes. Furthermore, in the driving mode of 1D1G, the fifth auxiliary line may be omitted from the pixel array substrate, so that the wiring units E and A1 may be omitted from the pixel array substrate.

Moreover, the pixel array substrate of the disclosure may be applied to a display device (not shown). In addition to the pixel array substrate, the display device may further include a counter substrate, a display medium located between the counter substrate and the pixel array substrate 1, and a driving device used for driving the pixel array substrate 1. For example, the driving device may include a chip. The chip may be bonded to the pixel array substrate 1 through a chip on film (COF) bonding process, a chip on glass (COG) bonding process, tape automated bonding (TAB) or other methods.

In view of the foregoing, in the embodiments of the disclosure, since the first auxiliary line terminates at one corresponding scan line and is unnecessary to be further extended to a position between two adjacent sub-pixels electrically connected to the corresponding scan line, a grey scale or brightness variation of the two adjacent sub-pixels due to the influence of the coupling effect between the horizontal scan line and the vertical auxiliary line is prevented. Moreover, during the process that the gate signal is transmitted to the corresponding scan line, the gate signal is transmitted to the first auxiliary line in the first conductive layer at the second end. During the process that the gate signal is transmitted in the first auxiliary line, the second portion of the second auxiliary line disposed above the first auxiliary line may shield the first auxiliary line, which avails reducing the influence of capacitive coupling on a plurality of the sub-pixels located adjacent to the first auxiliary line.

In some embodiments, in an overlapping range of the second portion of the second auxiliary line and the first auxiliary line, the line width of the second portion of the second auxiliary line may be greater than or equal to the line width of the first auxiliary line to further improve the shielding effect. In some embodiments, the second portion is, for example, connected to a DC signal end to provide a voltage stabilization effect. In some other embodiments, a potential of the second portion may be floating. In some embodiments, the disconnected first common electrode line and the disconnected second common electrode line may be electrically connected through a plurality of the third common electrode lines. In some embodiments, the third common electrode line and the third auxiliary line may adopt a design of wire overlapping to facilitate miniaturization of volume or improvement of resolution. In some embodiments, the third common electrode line may be electrically connected to the third auxiliary line overlapping therewith to reduce the wire resistance. In some embodiments, the wire resistance may be reduced through the design of overlapping and electrically connecting the third auxiliary line and the fourth auxiliary line.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A pixel array substrate, comprising:
a substrate;
a plurality of data lines, disposed on the substrate and arranged in a first direction;
a plurality of scan lines, disposed on the substrate and arranged in a second direction, wherein the second direction intersects with the first direction;
a plurality of sub-pixels, disposed on the substrate and arranged into a plurality of first rows arranged in the first direction and a plurality of second rows arranged in the second direction, wherein each of the first rows is electrically connected to at least one data line, and each of the second rows is electrically connected to one scan line;
a first auxiliary line, disposed on the substrate, wherein the first auxiliary line and the plurality of scan lines belong to a first conductive layer; and
a second auxiliary line, disposed on the substrate, wherein the second auxiliary line and the plurality of data lines belong to a second conductive layer,
wherein the first auxiliary line is located between two scan lines, the first auxiliary line has a first end and a second end opposite to the first end, the first end is connected to one of the two scan lines, the second end is separated from the other one of the two scan lines, and the second auxiliary line is electrically connected to the first auxiliary line at the second end through a conductive via,
wherein the plurality of scan lines comprise a plurality of first scan lines and a plurality of second scan lines, the plurality of first scan lines and the plurality of second scan lines are arranged in the second direction in an alternating manner and are electrically connected to the plurality of second rows respectively, the plurality of data lines comprise a plurality of first data lines and a plurality of second data lines, and the plurality of first data lines and the plurality of second data lines are arranged in the first direction in an alternating manner, wherein one first data line and one second data line are provided between any two adjacent first rows, one part of the sub-pixels in each first row is electrically connected to one adjacent first data line, and another part of the sub-pixels in each first row is electrically connected to one adjacent second data line, and
wherein the first auxiliary line is located between two adjacent first scan lines, the first end of the first auxiliary line is connected to one of the two adjacent first scan lines, the second end of the first auxiliary line is separated from the other one of the two adjacent first scan lines, one second scan line is provided between the two adjacent first scan lines, and the second scan line is not disposed on the substrate at a position where the first auxiliary line passes.

2. The pixel array substrate according to claim 1, wherein the second auxiliary line comprises a first portion and a second portion, the first portion and the second portion are arranged in the second direction, wherein the first portion crosses the scan line separated from the first auxiliary line in the two scan lines and is electrically connected to the first auxiliary line at the second end through the conductive via, the second portion is separated from the first portion at the second end, the second portion overlaps with the first auxiliary line in a normal direction of the substrate and crosses the scan line connected to the first auxiliary line, and the second portion is electrically insulated from the first auxiliary line and the scan line connected to the first auxiliary line.

3. The pixel array substrate according to claim 2, wherein a line width of the second portion is greater than or equal to a line width of the first auxiliary line outside the second end.

4. The pixel array substrate according to claim 2, wherein the first portion is connected to a gate signal end, and the second portion is connected to a direct current signal end.

5. The pixel array substrate according to claim 1, further comprising:
a plurality of first common electrode lines and a plurality of second common electrode lines, disposed on the substrate and arranged in the second direction in an alternating manner, wherein one first common electrode line and one second common electrode line are provided between any two adjacent scan lines; and
a plurality of third common electrode lines, disposed on the substrate, wherein each of the third common electrode lines is connected between one first common electrode line and one adjacent second common electrode line,
wherein the first common electrode lines, the second common electrode lines, and the third common electrode lines also belong to the first conductive layer, and
wherein at least one first common electrode line and at least one second common electrode line are provided between the two scan lines located at two opposite ends of the first auxiliary line, each one of the at least one first common electrode line and the at least one second common electrode line is disconnected at a position where the first auxiliary line passes, and the disconnected at least one first common electrode line and the disconnected at least one second common electrode line are electrically connected through the third common electrode lines.

6. The pixel array substrate according to claim 5, wherein at least one third common electrode line is provided at each of two opposite sides of the first auxiliary line in the first direction.

7. The pixel array substrate according to claim 5, wherein the second auxiliary line overlaps with at least one third common electrode line in a normal direction of the substrate and is electrically insulated from the at least one third common electrode line.

8. The pixel array substrate according to claim 5, further comprising:
a plurality of third auxiliary lines, disposed on the substrate, wherein at least one third auxiliary line is located between two adjacent first rows, and each of the third auxiliary lines crosses the plurality of scan lines and is electrically insulated from the plurality of scan lines.

9. The pixel array substrate according to claim 8, wherein the plurality of third auxiliary lines also belong to the second conductive layer.

10. The pixel array substrate according to claim 8, wherein each of the third common electrode lines overlaps with one third auxiliary line in a normal direction of the substrate, and at least one of the third common electrode lines is electrically connected to the third auxiliary line overlapping therewith.

11. The pixel array substrate according to claim 8, wherein at least one third auxiliary line adjacent to the second auxiliary line overlaps with plural third common electrode lines in a normal direction of the substrate and is electrically connected to the plural third common electrode lines.

12. The pixel array substrate according to claim 8, further comprising:
a plurality of fourth auxiliary lines, disposed on the substrate, wherein each of the fourth auxiliary lines is located between one first common electrode line and one adjacent second common electrode line and is separated from the one first common electrode line and the one adjacent second common electrode line.

13. The pixel array substrate according to claim 12, wherein the plurality of fourth auxiliary lines also belong to the first conductive layer.

14. The pixel array substrate according to claim 12, wherein at least one of the third auxiliary lines overlaps with plural fourth auxiliary lines in the normal direction and is electrically connected to the plural fourth auxiliary lines.

15. The pixel array substrate according to claim 12, wherein the second auxiliary line overlaps with plural fourth auxiliary lines in the normal direction and is electrically connected to the plural fourth auxiliary lines.

16. The pixel array substrate according to claim 1, further comprising:
a fifth auxiliary line, disposed on the substrate and located between two adjacent first rows, wherein the fifth auxiliary line and the first auxiliary line are respectively located at opposite sides of the first scan line electrically connected to the first auxiliary line in the second direction, and the fifth auxiliary line connects the first scan line electrically connected to the first auxiliary line to one adjacent second scan line.

17. The pixel array substrate according to claim 16, wherein the fifth auxiliary line also belongs to the first conductive layer.

18. The pixel array substrate according to claim 1, further comprising:
a plurality of wiring units, disposed corresponding to the plurality of sub-pixels, wherein plural wiring units between two adjacent first rows where the first auxiliary line and the second auxiliary line are located comprise four or more types of wiring structures.

19. A pixel array substrate, comprising:
a substrate;
a plurality of data lines, disposed on the substrate and arranged in a first direction;
a plurality of scan lines, disposed on the substrate and arranged in a second direction, wherein the second direction intersects with the first direction;
a plurality of sub-pixels, disposed on the substrate and arranged into a plurality of first rows arranged in the first direction and a plurality of second rows arranged in the second direction, wherein each of the first rows is electrically connected to at least one data line, and each of the second rows is electrically connected to one scan line;
a first auxiliary line, disposed on the substrate, wherein the first auxiliary line and the plurality of scan lines belong to a first conductive layer; and
a second auxiliary line, disposed on the substrate, wherein the second auxiliary line and the plurality of data lines belong to a second conductive layer,
wherein the first auxiliary line is located between two scan lines, the first auxiliary line has a first end and a second end opposite to the first end, the first end is connected to one of the two scan lines, the second end is separated from the other one of the two scan lines, and the second auxiliary line is electrically connected to the first auxiliary line at the second end through a conductive via,
wherein the pixel array substrate further comprises:
a plurality of first common electrode lines and a plurality of second common electrode lines, disposed on the substrate and arranged in the second direction in an alternating manner, wherein one first common electrode line and one second common electrode line are provided between any two adjacent scan lines; and
a plurality of third common electrode lines, disposed on the substrate,
wherein each of the third common electrode lines is connected between one first common electrode line and one adjacent second common electrode line,
wherein the first common electrode lines, the second common electrode lines, and the third common electrode lines also belong to the first conductive layer, and
wherein at least one first common electrode line and at least one second common electrode line are provided between the two scan lines located at two opposite ends of the first auxiliary line, each one of the at least one first common electrode line and the at least one second common electrode line is not disposed on the substrate at a position where the first auxiliary line passes, and the at least one first common electrode line and the at least one second common electrode line are electrically connected through the third common electrode lines, and
wherein the second auxiliary line overlaps with at least one third common electrode line in a normal direction of the substrate and is electrically insulated from the at least one third common electrode line.

* * * * *